United States Patent [19]

Gomez

[11] 4,251,290
[45] Feb. 17, 1981

[54] THERMOPILE FORMED OF CONDUCTORS

[76] Inventor: Ernesto E. Gomez, Avianca Bldg., 3rd Floor, Ponce de Leon Ave., Santurce, P.R. 00909

[21] Appl. No.: 200

[22] Filed: Jan. 2, 1979

[51] Int. Cl.³ .......................................... H01L 35/00
[52] U.S. Cl. .................................... 136/206; 136/208; 136/212; 136/225; 136/236 R
[58] Field of Search ............... 136/206, 208, 212, 225, 136/236 R

[56] References Cited

U.S. PATENT DOCUMENTS

| | | | |
|---|---|---|---|
| 1,585,159 | 5/1926 | Logwood | 136/208 X |
| 2,325,759 | 8/1943 | Finch | 136/236 X |
| 2,337,000 | 12/1943 | Ray | 136/227 |
| 3,284,245 | 11/1966 | Nottage et al. | 136/212 |
| 3,607,445 | 9/1971 | Hines | 136/225 |
| 3,648,470 | 4/1972 | Schultz | 136/225 |
| 3,671,327 | 3/1972 | Gay | 136/225 |

FOREIGN PATENT DOCUMENTS

| | | | |
|---|---|---|---|
| 1222504 | 2/1971 | United Kingdom | 136/225 |
| 1357217 | 6/1974 | United Kingdom | 136/225 |

Primary Examiner—Leland A. Sebastian
Attorney, Agent, or Firm—Peter L. Berger

[57] ABSTRACT

A thermocouple and thermopile formed of conductor elements. The conductors are joined at thermocouple junctions, with the junction areas being relatively large compared with the normal cross-sectional area of the conductor elements. By providing large cross-sectional areas of the thermocouple junctions, reduction in resistance and heat concentration is achieved, so that the resulting thermocouple and thermopile may easily be used for solar energy collection to produce an electrical current and voltage related to the available solar energy.

16 Claims, 7 Drawing Figures

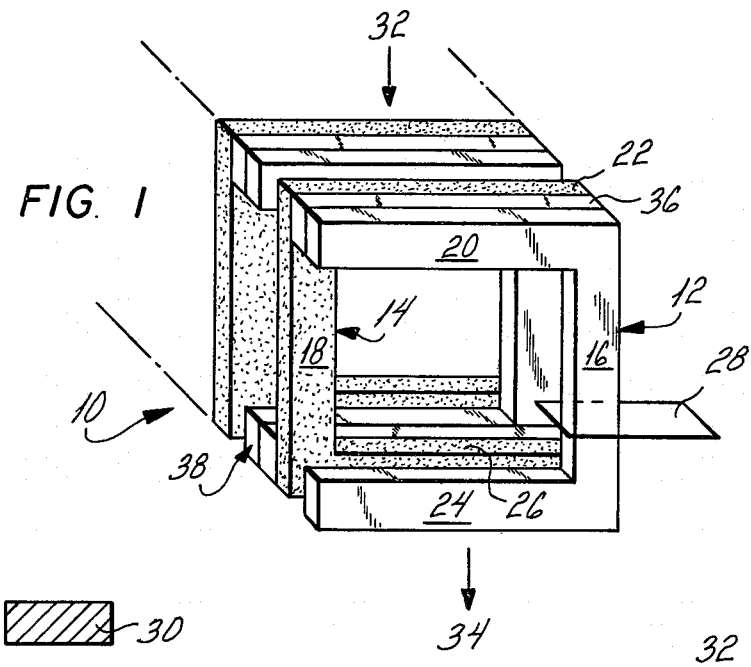
FIG. 1
FIG. 2
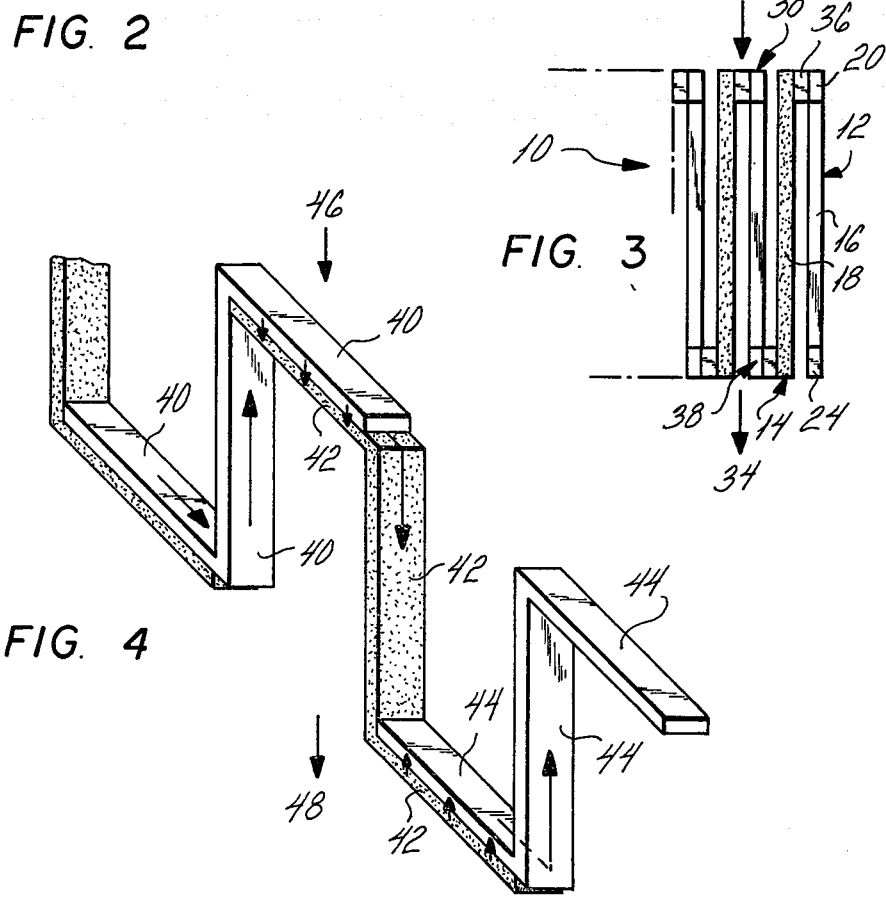
FIG. 3
FIG. 4

THERMOPILE FORMED OF CONDUCTORS

BACKGROUND OF THE INVENTION

This invention relates to a novel thermocouple and thermopile construction employing conductors.

Conventionally, thermocouples are formed of two wires or rods of different materials joined at respective junctions, with one of the junctions being a hot region, while the other is a cold region.

In accordance with well known principles, a thermoelectric voltage is formed between the junctions, and one of the materials is broken to form a set of terminals so that current can flow between the junctions and through the materials.

Thermocouples formed of conductor elements have been employed as temperature sensing elements in many types of environments, especially with cookware. One of the important aspects of these thermocouples is the effect of sensing of the temperature level, and such elements have been constructed with the junction between the conductors being as small as possible, in order to enable the junction to be in close proximity to the source of heat.

With the advent of the need to discover alternate sources of energy, solar energy has been considered a prime resource. Thermocouples and thermopiles have been presented, with the above-cited patents being illustrative, and these are generally formed of semiconductor elements in various environments for utilizing the heat generated by the sun to form thermopiles which serve as a souce of electrical current and voltage. Semiconductor materials have inherent disadvantages, especially relating to cost and resistance levels, so that the voltage generated in the elements often does not enable large currents to be developed. In other aspects, semiconductor materials are formed of precious metals, which are becoming increasingly difficult to obtain and increasingly expensive.

An object of this invention is to provide an improved thermocouple formed of conventional conductor elements which are suitable for the gereration of electrical energy from the sun.

Another object of this invention is to provide such a large junction area thermocouple formed of inexpensive elements, relatively easily obtainable and suitable for easy application in many underdeveloped parts of the world.

Yet another object of this invention is to provide such a thermocouple which is easy to manufacture, sturdy in use, and easy to assemble.

Another object of this invention is to provide such a thermocouple and thermoelectric generator formed of thermoelectric elements which have advantageous physical construction to enhance the generation of electricity and minimize the loss of heat or power.

Other objects and advantages and features of this invention will become more apparent hereinafter.

SUMMARY OF THE INVENTION

In accordance with the principles of this invention, the above objects are accomplished by providing a thermocouple formed of two conductors, with the conductors being joined in hot and cold regions. Each of the conductors has a generalized cross-sectional area, and the thermocouple comprises such conductors having a junction area significantly greater than the cross-sectional area of either of the elements.

Each of the conductors is formed of a general square shape, with one shape being that of a squared C. The upper and lower legs of the squared C are alternately joined in regions of heat and cold to form junctions, with the junction surface area being the facing side of the leg portions of the C-shape conductor elements.

As another embodiment, the elements are formed of squared Z-shape conductors with the upper and lower legs being alternately joined such that the facing surfaces form the thermocouple junctions.

In still another embodiment, the elements are also square Z-shaped, but are placed one on top of the other in an elongated fashion to form a thermopile of individual thermocouples.

In still another form, the thermopile is made of a triangular shape with the legs of the thermopile being formed of individual conductors, with the conductors joined at their overlapping portions. As a feature of this embodiment, an efficient method of constructing such a thermoplie may be achieved by forming a grid, with the grid being formed of the conductors overlaid in a crosswire orientation. By cutting and joining the overlaid conductors at their intersections, triangular thermopiles may be formed in an efficient and quick manner. The cross-sectional area of the mating surface of the junctions is that of the portions of the materials overlapping at the junctions, and each conductor may be extremely thin, so that the cross-sectional area of the junctions will be larger than the cross-sectional area of each of the conductor elements.

The use of large area junctions reduces the resistance in the thermocouple electrical path enabling an increase in current to be realized. Further, such large area junctions tend to minimize loss of junction heat by enlarging the area subjected to said heat.

BRIEF DESCRIPTION OF THE DRAWINGS

FIG. 1 is a perspective view of one embodiment of the present invention illustrating C-shape elements.

FIG. 2 is a cross-section taken through one of said C-shape elements.

FIG. 3 is a side view of the embodiment illustrated in FIG. 1.

FIG. 4 is a perspective view of another embodiment of the instant invention illustrating square Z-shape elements.

DETAILED DESCRIPTION

Figure 5:
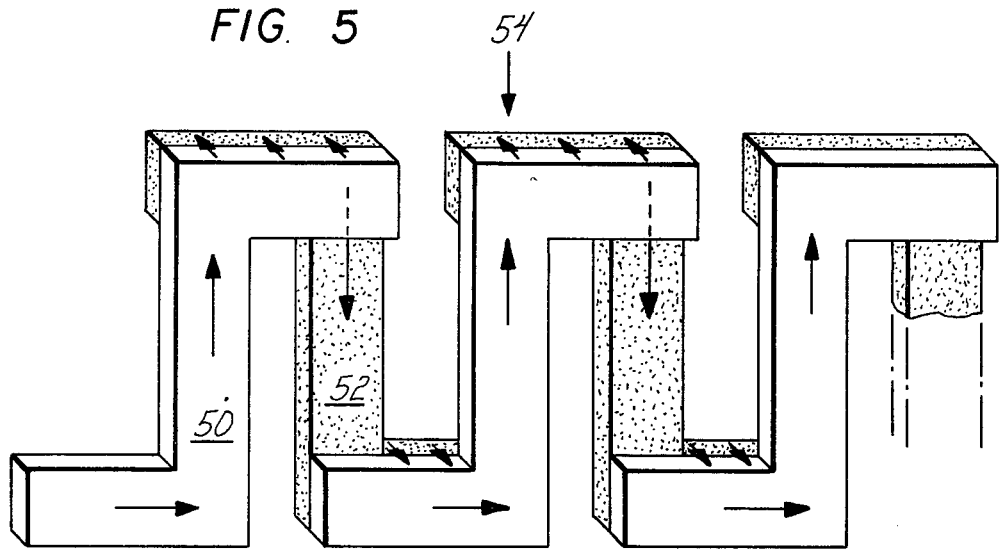
FIG. 5 is another embodiment of the invention illustrating square Z-shape elements arranged in overlapping relationship.

Turning now to the drawings, there is shown in FIG. 1 an embodiment of the instant invention comprising a thermopile generally designated with the numeral 10 formed of an element 12 comprising a conductor of one material and another element 14 formed of a conductor of a same or dissimilar material, with the elements having a square C-shape.

Elements 12 and 14 comprise intermediate sections 16 and 18, respectively and upper leg portions 20 and 22, respectively, and lower leg portions 24 and 26, respectively. A generalized cross-sectional shape is generated along a plane 28 which is substantially perpendicular to the plane formed by the conductor elements, and the cross-sectional area 30 of the elements is illustrated in FIG. 2. The cross-sectional area is generally rectangular and is approximately the same through the leg and intermediate portions of the elements 12 and 14.

As illustrated in FIG. 1, a thermopile is formed of successive pairs of reversely arranged square C-shape elements located between a heat source 32 and a heat sink 34. When the elements 12 and 14 are placed side-by-side, a conducting spacer 36 is employed between respective legs of adjacent elements so as to make electrical connections at the thermoelectric junction. Thus, a thermoelectric junction is formed at the upper portion of the first element 12 which has its leg 20 in an electrical contact with leg 22 of element 14. As may be seen, the junction surface is the facing surfaces of legs 20 and 22, whose cross-sectional areas is significantly greater than the cross-sectional area of either of the elements, as illustrated in FIG. 2.

The arrangement of C-shape elements has advantageous features in that there is a minimum of heat transfer across the element, since intermediate section 16 is a thin connecting portion between legs 20 and 24. Such a thin intermediate portion minimizes heat flow between the heat source 32 and heat sink 34, so as to maximize temperature differences between the thermoelectric junctions, in order to increase the voltage developed therebetween.

Referring to FIG. 3, there is shown a thermopile formed of repetitive pairs of oppositely disposed squared C-shape elements. Referring to FIG. 1, the current flows through leg 24, up intermediate sections 16, through leg 20, across the junction between legs 20 and 22, down intermediate section 18, into leg 26 across the junction between leg 26 and the leg of the next C-shape element 38, along the bottom leg of C-shape element 38 and upwardly through its intermediate portion to the next junction, which is at the next upper leg. In this fashion, the current flows alternatively upwardly and downwardly through the C-shape elements with a number of thermocouples forming the thermopile.

FIG. 4 illustrates another embodiment of the instant invention in which squared Z-shape elements are employed with the junction being formed between the facing surfaces of reversely disposed squared Z-shape elements. In particular, the thermoelectric current will flow as indicated by the arrow through the bottom leg of first element 40 upwardly through the intermediate section across the junction between the first element 40 and second element 42, downwardly through the intermediate section of element 42, across the junction between element 42 and the next element 44 and upwardly through the intermediate section of element 44. The thermopile is formed of a number of such elements, with the heat source 46 being located at one junction area while the heat sink 48 is located at the opposite junction area. The difference in voltage formed at the junctions due to the thermoelectric differences enables the current to flow through the sequence of joined thermoelectric elements to form the thermocouple and thermopile of the instant invention. The area of the thermocouple junction is the facing surface of the adjoining elements which is relatively large in comparison to the cross-sectional area of any of the elements.

FIG. 5 illustrates yet another embodiment of this invention where the thermocouple and thermopile is formed of overlapped squared Z-shape elements 50 and 52. A heat source 54 is located at the upper junctions while heat sink 56 is located in the lower junctions. Thermoelectric current flows through the thermopile as indicated by the arrow. Such thermoelectric current crosses the junction between the matching respective legs of elements 50 and 52 and then vertically through the respective intermediate portions of the elements 52, then along the need for separate conductors to be integrated in the thermocouples.

Materials which may serve as elements in the thermocouple of this invention are generally identified as being electrical conductors. Materials such as nickel, nickel alloys, iron, iron alloys, and iron alloys with silicon, especially ductile iron may all be employed. Additionally, copper may be employed as well as copper alloys.

The individual elements illustrated in the prior figures may be easily formed by conventional metal forming techniques. The specific C and Z shapes employed are not intended to be limiting but are merely illustrative of conductor elements employed in the thermocouple with the junction between adjacent thermocouple elements being formed of the elements themselves because of their electrical current carrying characteristics. These shapes also provide for large junction areas and narrow intermediate sections.

As another aspect of this invention, the relative surface areas may be arranged to be sized in relation to the resistivity of the materials in order to minimize impedance differences at the junctions.

Figure 6:
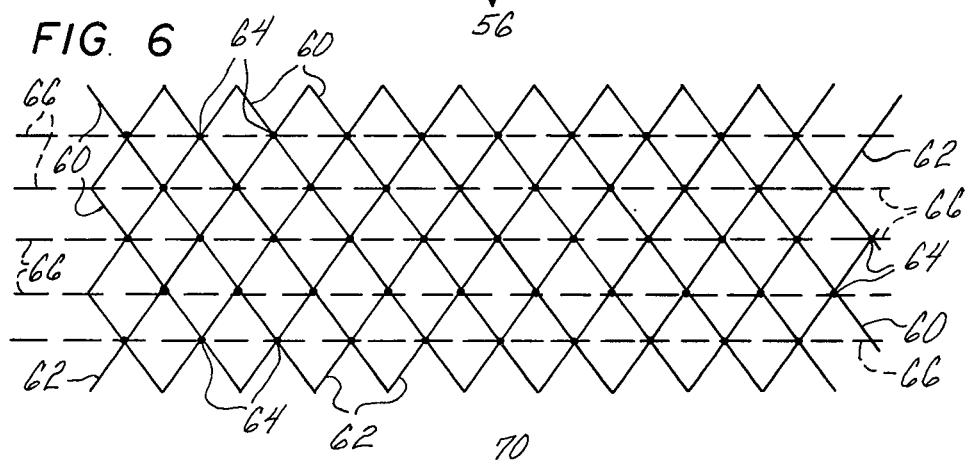
FIG. 6 is a pictorial representation of the method of forming another embodiment of the instant invention.
Figure 7:
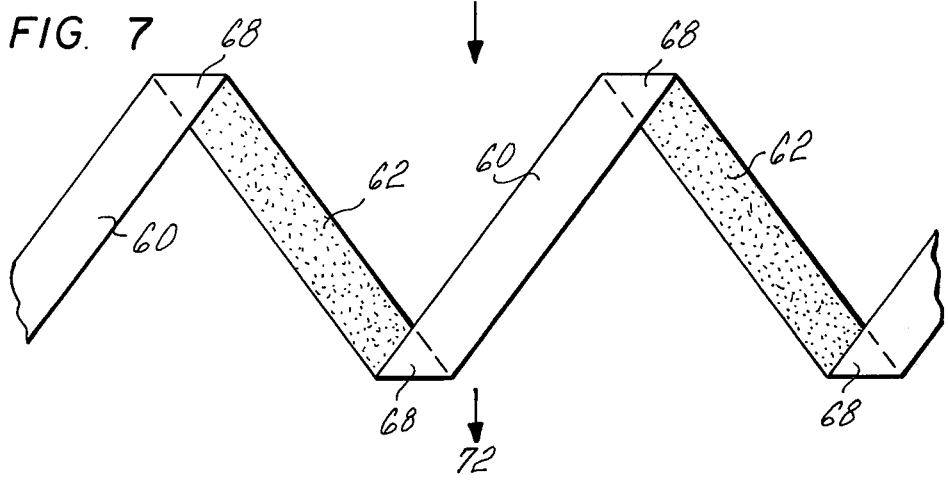
FIG. 7 is a top view of the thermopile formed in accordance with the method illustrated in FIG. 6.

FIGS. 6 and 7 illustrate one method of forming large numbers of thermocouples, with a series of triangular thermocouples being produced. Referring to FIG. 6, a plurality of first conductors 60 are laid in parallel relationship to each other and on a slant and a plurality of second conductors 62 are laid crosswise across first conductors 60 with intersections formed therebetween as at 64. A grid is formed of elements 60 and 62 so interlaced and a cutting operation is performed along lines 66 after the materials 60 and 62 have been joined at their intersections. The resulting thermocouple is illustrated in FIG. 7 and the junction 68 between elements 60 and 62 is formed of the overlapping portions of the elements joined at their intersections. The thermocouple and thermopile formed in accordance with FIGS. 6 and 7 is then placed between heat source 70 and heat sink 72, so that the junctions are located in the respective heat source and heat sink regions to generate an electric current through the thermopile. As may further be seen, the thermocouple formed in accordance with FIG. 7 comprises conductors joined in regions of relative heat and cold with the area of the junction 68 being substantially larger than the cross-sectional area taken through a plane perpendicular to the conductors, since conductors 60 and 62 are thin strips of metal.

Although this invention has been described with solar energy being the source of heat, it is understood that the novel thermopile of this invention may be used with any source of heat. For instance, the invention may recapture energy usually deposed of such as heat escaping from a building during the winter. Other sources of heat may also be employed.

I claim:

1. A current generator for generating current related to a source of thermal energy, said current generator comprising a thermocouple comprising two materials joined in separate regions one of said regions being thermally hot with respect to the other region, each of said materials comprising an electrical conductor, each of said conductors having a general cross-sectional area taken along a plane substantially perpendicular to the plane formed by the conductor, said conductors being electrically joined together at mating surfaces thereof with the junction area of the mating surfaces between the conductors being greater than the cross-sectional area of either of the conductors, one of said junctions being in one of said regions and the other in the other of said regions, each of the junction areas being substantially equal in size, each of said conductors comprising leg members separated by an intermediate section, said junction between said conductors comprising respective pairs of said leg members joined together in said regions, said intermediate section separating said legs such that said regions are distant from each other to minimize the thermal effect of one on the other.

2. The thermocouple as claimed in claim 1, wherein each of the mating surfaces is planar.

3. The thermocouple as claimed in claim 1, wherein each of said conductors comprises leg members separated by an intermediate section, said junction between said conductors comprising respective pairs of said leg members joined together.

4. The thermocouple as claimed in claim 3, wherein each of said conductors comprises a squared C-shape member, with the junction between said conductors formed by electrically joining contiguously located leg portions of respective conductors.

5. The thermocouple as claimed in claim 4, wherein the cross-sectional area of each of said squared C-shape members is substantially rectangular in shape, with said conductors being placed in side-by-side orientation, further comprising electrically conducting spacer means being placed between the respective side surfaces of the leg portions for forming said electrical junction.

6. The thermocouple as claimed in claim 1, wherein said conductors are arranged to be side-by-side with said junction formed by adjoining surfaces contacting each other.

7. The thermocouple as claimed in claim 3, wherein each of said conductors comprises a squared Z-shape and said junction is formed by placing said conductors in face-to-face contact such that the side surface of the leg of one conductor touches the side surface of the leg of another conductor.

8. The thermocouple as claimed in claim 3, wherein each of said conductors comprises a squared Z-shape and said junction is formed by touching the upper surface of one leg of said conductor to the bottom surface of one leg of the other conductor, such that said mating surface is formed by the overlapping upper and lower surface portions of the mating leg segments of the conductors.

9. The thermocouple of claim 1, wherein said conductors are formed of metal strips connected to form a triangular shape with the vertex of the triangle formed by the overlapping of said elements forming said junction.

10. The thermocouple of claim 1, wherein each of said conductors is formed of a different metal.

11. The thermocouple of claim 10, wherein one of said conductors comprises an iron material and the other comprises an iron alloy.

12. A thermopile comprising a plurality of thermocouples each comprising pairs of electrical conductors joined in separate regions, one of said regions being thermally hot with respect to the other region, each of said conductors having a general cross-sectional area taken along a plane substantially perpendicular to the plane formed by the conductor, said pairs of conductors being electrically joined together at mating surfaces with the junction area of the mating surfaces between the conductors being greater than the cross-sectional areas of the conductors, one of said junctions being in said one of said regions and the other in the other of said regions, each of the junction areas being substantially equal in size, each of said conductors comprising leg members separated by an intermediate section, said junction between said conductors comprising respective pairs of said leg members joined together in said regions, said intermediate section separating said legs such that said regions of heat and cold are distant from each other to minimize the thermal effect of one on the other.

13. The thermopile as claimed in claim 12, wherein each of said conductors is squared C-shape, said thermopile being formed by reversing the direction of the legs of each adjoining conductor and making electrical coneections alternately at the upper and lower contacting surfaces.

14. The thermopile as claimed in claim 12, wherein each of said conductors comprises a squared Z-shape and said junctions are formed by placing said conductors in face-to-face contact such that the side surface of the leg of one conductor touches the side surface of the leg of the next conductor.

15. The thermopile as claimed in claim 12, wherein each of said conductors comprises a squared Z-shape and said junctions are formed by touching the upper surface of one leg of one conductor to the bottom surface of one leg of the next conductor such that said mating surface is formed by the overlapping upper and lower surface portions of the mating leg segments of the conductors.

16. The thermopile as claimed in claim 12, wherein said thermopile comprises a plurality of triangular shapes connected end to end, with the two legs of the triangle comprising said pairs of conductors.

* * * * *